US010373880B2

(12) United States Patent
Xiao

(10) Patent No.: US 10,373,880 B2
(45) Date of Patent: Aug. 6, 2019

(54) SEMICONDUCTOR DEVICE AND RELATED MANUFACTURING METHOD

(71) Applicant: Semiconductor Manufacturing International (Shanghai) Corporation, Shanghai (CN)

(72) Inventor: Deyuan Xiao, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 15/704,623

(22) Filed: Sep. 14, 2017

(65) Prior Publication Data

US 2018/0005890 A1 Jan. 4, 2018

Related U.S. Application Data

(62) Division of application No. 15/138,963, filed on Apr. 26, 2016, now Pat. No. 9,793,173.

(30) Foreign Application Priority Data

May 8, 2015 (CN) .......................... 2015 1 0232427

(51) Int. Cl.

*H01L 21/84* (2006.01)
*H01L 27/12* (2006.01)

(Continued)

(52) U.S. Cl.

CPC ........ *H01L 21/8252* (2013.01); *H01L 21/845* (2013.01); *H01L 27/092* (2013.01);

(Continued)

(58) Field of Classification Search

CPC ...................... H01L 29/7839; H01L 27/0924; H01L 21/845

See application file for complete search history.

(56) References Cited

U.S. PATENT DOCUMENTS 8,884,363 B2 11/2014 Xiao et al.
2005/0035409 A1 2/2005 Ko et al.

(Continued)

FOREIGN PATENT DOCUMENTS

CN 101740388 A 6/2010

OTHER PUBLICATIONS

B. Soree et al., "Silicon nanowire pinch-off FET: Basic operation and analytical model,", in Proc. Ultimate Integr. Silicon, Apr. 2009, 5 pages.

(Continued)

*Primary Examiner* — Elias Ullah

(74) *Attorney, Agent, or Firm* — Innovation Counsel LLP

(57) ABSTRACT

A semiconductor device may include a substrate, an n-channel field-effect transistor positioned on the substrate, and a p-channel field-effect transistor positioned on the substrate. The n-channel field-effect transistor may include an n-type silicide source portion, an n-type silicide drain portion, and a first n-type channel region. The first n-type channel region may be positioned between the n-type silicide source portion and the n-type silicide drain portion and may directly contact each of the n-type silicide source portion and the n-type silicide drain portion.

7 Claims, 7 Drawing Sheets

(51) Int. Cl.

| | |
|---|---|
| ***H01L 27/092*** | (2006.01) |
| ***H01L 21/8238*** | (2006.01) |
| ***H01L 21/8252*** | (2006.01) |
| ***H01L 29/66*** | (2006.01) |
| ***H01L 29/78*** | (2006.01) |

(52) U.S. Cl.

CPC ........ *H01L 27/1211* (2013.01); *H01L 29/665* (2013.01); *H01L 29/7839* (2013.01); *H01L 21/823807* (2013.01); *H01L 21/823814* (2013.01); *H01L 21/823821* (2013.01); *H01L 27/0924* (2013.01)

(56) References Cited

U.S. PATENT DOCUMENTS

2010/0012951 A1* 1/2010 Yatsuo .................. H01L 29/086 257/77
2010/0276662 A1 11/2010 Colinge
2011/0198702 A1* 8/2011 Ohmi ................ H01L 21/28079 257/369
2011/0291190 A1 12/2011 Xiao et al.

OTHER PUBLICATIONS

J.-P. Colinge et al., "Nanowire transistors without junctions," Nature. Nanotechnology., vol. 5, No. 3, Feb. 2010, 6 pages.
D. Xiao et al., "A novel GAAC FinFet transistor: device analysis, 3D TCAD simulation and fabrication," Journal of Semiconductors, vol. 30, No. 1, Jan. 2009, 5 pages.
D. Xiao et al., "A novel accumulation mode complementary GAAC FinFets inverter with hybrid orientation SOI substrate," Chinese Journal, Jan. 2009, 10 pages.
E. Gnani et al., "Theory of the Junctionless Nanowire FET," IEEE Trans. Electron Devices, vol. 58, No. 9, pp. 2903-2910, Sep. 2011.
J.P. Duarte, et al., "A Nonpiecewise Model for Long-Channel Junctionless Cylindrical Nanowire FETs," IEEE EDL, vol. 33, No. 2, Feb. 2012, pp. 155-157.

* cited by examiner

SEMICONDUCTOR DEVICE AND RELATED MANUFACTURING METHOD

CROSS-REFERENCE TO RELATED APPLICATION

This is a divisional of U.S. patent application Ser. No. 15/138,963, filed on Apr. 26, 2016, which application claims priority to Chinese Patent Application No. 201510232427.9, filed on May 8, 2015, each of which are incorporated herein by reference in their entireties.

BACKGROUND

The technical field is related to a semiconductor device and a method for manufacturing the semiconductor device.

In semiconductor devices with substantially small sizes, short-channel effects may negatively affect performance of the semiconductor devices. The semiconductor devices may be implemented with fin structures for mitigating short-channel effects. Nevertheless, channels regions in the fin structures may have unsatisfactory mobility, and improvement in the semiconductor devices may be desirable.

SUMMARY

An embodiment may be related to a semiconductor device. The semiconductor device may include a substrate, an n-channel field-effect transistor positioned on the substrate, and a p-channel field-effect transistor positioned on the substrate. The n-channel field-effect transistor may include an n-type silicide source portion, an n-type silicide drain portion, and a first n-type channel region. The first n-type channel region may be positioned between the n-type silicide source portion and the n-type silicide drain portion and may directly contact each of the n-type silicide source portion and the n-type silicide drain portion. The n-channel field-effect transistor may be a p-n-junctionless mode n-channel field-effect transistor that does not have a p-n junction between the first-n-type channel region and either of the n-type silicide source portion and the n-type silicide drain portion. The p-channel field-effect transistor may be an inversion mode p-channel field-effect transistor.

The substrate may be or may include at least one of a germanium-on-insulator layer, a germanium layer, and a III-V compound semiconductor layer.

The p-channel field-effect transistor may include a p-type silicide source portion, a p-type silicide drain portion, and a second n-type channel region. The second n-type channel region may be positioned between the p-type silicide source portion and the p-type silicide drain portion.

The first n-type channel region may be a first portion of a fin structure. A cross section of the first n-type channel region has at least one of a linear shape, a triangular shape, a rectangular shape, and a circular shape. The second n-type channel region may be a second portion of the fin structure. The fin structure may be formed of or may include at least one of germanium, silicon-germanium, and a III-V compound semiconductor material. A doping concentration value of the second n-type channel region may be less than a doping concentration value of the first n-type channel region.

A doping concentration value at a surface portion of the first n-type channel region may be higher than a doping concentration value at an inner portion of the first n-type channel region.

The doping concentration of the first n-type channel region may decrease from the surface portion of the first n-type channel region to an inner center portion of the first n-type channel region. The doping concentration value at the surface portion of the first n-type channel region may be greater than or equal to 1E19 atoms/$cm^3$.

An embodiment may be related to a semiconductor device. The semiconductor device may include a substrate, an n-channel field-effect transistor positioned on the substrate, and a p-channel field-effect transistor positioned on the substrate. The n-channel field-effect transistor may be a p-n-junctionless mode n-channel field-effect transistor. The p-channel field-effect transistor may be an inversion mode p-channel field-effect transistor. The n-channel field-effect transistor may include an n-type source portion, an n-type drain portion, and a first n-type channel region. The first n-type channel region may be positioned between the n-type source portion and the n-type drain portion and directly contacts each of the n-type source portion and the n-type drain portion. The p-channel field-effect transistor may include a first p-type source portion, a second p-type source portion, a first p-type drain portion, a second p-type drain portion, and a second n-type channel region. The second n-type channel region may be positioned between the first p-type source portion and the first p-type drain portion. The first p-type source portion and the first p-type drain portion may be positioned between the second p-type source portion and the second p-type drain portion. A doping concentration value of the first p-type source portion may be less than a doping concentration value of the second p-type source portion.

The p-channel field-effect transistor may include a p-type silicide source portion and a p-type silicide drain portion. The second p-type source portion and the second p-type drain portion may be positioned between the p-type silicide source portion and the p-type silicide drain portion.

The second p-type drain portion may include a first metal silicide portion. The n-type drain portion may include a second metal silicide portion. The second metal silicide portion directly contacts the first metal silicide portion.

An embodiment may be related to a method for manufacturing a semiconductor device. The method may include the following steps: preparing a substrate; providing an n-channel field-effect transistor positioned on the substrate; and providing a p-channel field-effect transistor positioned on the substrate. The n-channel field-effect transistor may include an n-type silicide source portion, an n-type silicide drain portion, and a first n-type channel region. The first n-type channel region may be positioned between the n-type silicide source portion and the n-type silicide drain portion and directly contacts each of the n-type silicide source portion and the n-type silicide drain portion. The n-channel field-effect transistor may be a p-n-junctionless mode n-channel field-effect transistor. The p-channel field-effect transistor may be an inversion mode p-channel field-effect transistor.

The substrate may be or may include at least one of a germanium-on-insulator layer, a germanium layer, and a III-V compound semiconductor layer.

The first n-type channel region may be a first portion of a fin structure. The p-channel field-effect transistor may include a second n-type channel region. The second n-type channel region may be a second portion of the fin structure. The fin structure may be formed of or may include at least one of germanium, silicon-germanium, and a III-V compound semiconductor material.

A doping concentration value at a gate-channel interface of the first n-type channel region may be higher than a doping concentration value at a center portion of the first n-type channel region. The doping concentration of the first n-type channel region decreases from a gate-channel interface of the first n-type channel region to an inner center portion of the first n-type channel region.

The p-channel field-effect transistor may include a p-type silicide source portion, a p-type silicide drain portion, and a second n-type channel region. The second n-type channel region may be positioned between the p-type silicide source portion and the p-type silicide drain portion.

The p-channel field-effect transistor may include a first p-type source portion, a second p-type source portion, a first p-type drain portion, a second p-type drain portion, and a second n-type channel region. The second n-type channel region may be positioned between the first p-type source portion and the first p-type drain portion. The first p-type source portion and the first p-type drain portion may be positioned between the second p-type source portion and the second p-type drain portion. A doping concentration value of the first p-type source portion may be less than a doping concentration value of the second p-type source portion.

The p-channel field-effect transistor may include a p-type silicide source portion and a p-type silicide drain portion. The second p-type source portion and the second p-type drain portion may be positioned between the p-type silicide source portion and the p-type silicide drain portion.

An embodiment may be related to a method for manufacturing a semiconductor device. The method may include preparing a substrate. The method may include providing a p-n-junctionless mode n-channel field-effect transistor positioned on the substrate. The method may include providing an inversion mode p-channel field-effect transistor positioned on the substrate. The method may have one or more of the aforementioned features.

An embodiment may be related to an electronic device. The electronic device may include an electronic component and the semiconductor device. The semiconductor device may be electrically connected to the electronic component and may have one or more of the aforementioned features.

According to embodiments, the semiconductor device may function as a complementary metal-oxide-semiconductor (CMOS) inverter. According to embodiments, channel regions of the semiconductor device may have substantially high mobility, and the semiconductor device may perform sufficiently strong electron inversion. Advantageously, satisfactory performance of the semiconductor device may be attained.

The above summary is related to some of many embodiments disclosed herein and is not intended to limit the scope of embodiments.

DETAILED DESCRIPTION

Figure 1:
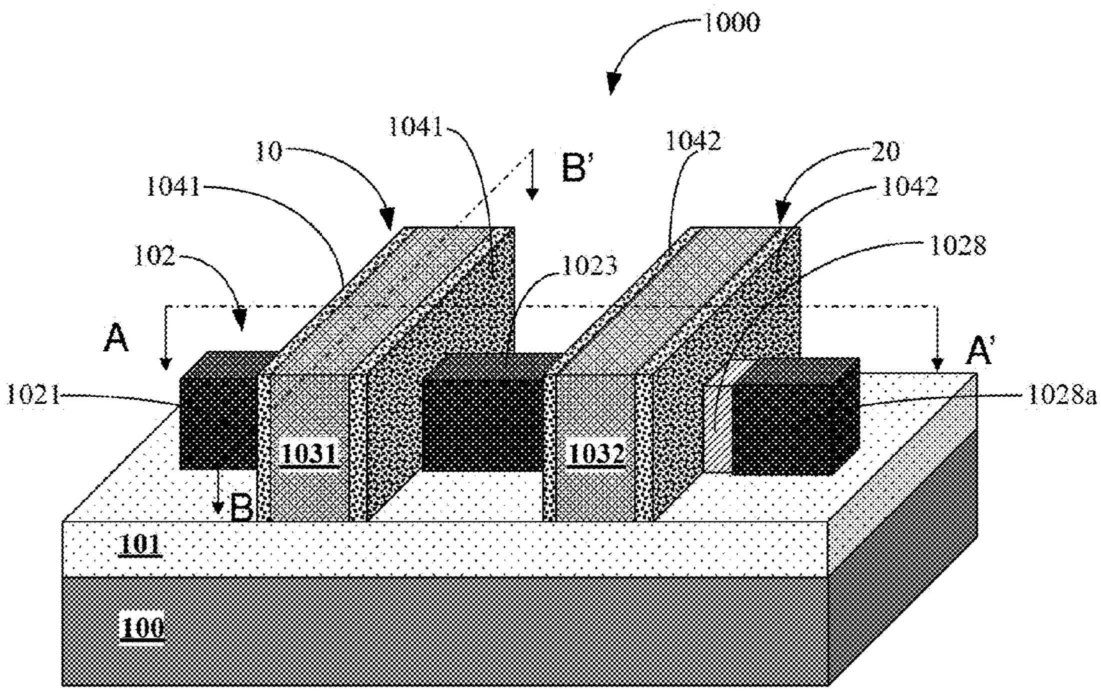
FIG. 1 shows a schematic diagram (e.g., a schematic perspective view) that illustrates elements and/or structures in a semiconductor device in accordance with one or more embodiments.

Example embodiments are described with reference to the accompanying drawings. As those skilled in the art would realize, the described embodiments may be modified in various different ways, all without departing from the spirit or scope. Embodiments may be practiced without some or all of these specific details. Well known process steps and/or structures may not have been described in detail in order to not unnecessarily obscure described embodiments.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting possible embodiments. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements should not be limited by these terms. These terms may be used to distinguish one element from another element. Thus, a first element discussed below may be termed a second element without departing from embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may be provided between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the embodiments. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive". The term "electrically connected" may mean "electrically connected without any intervening transistors".

The term "conductor" may mean "electrically conductive member". The term "insulator" may mean "electrically insulating member". The term "dielectric" may mean "dielectric member". The term "interconnect" may mean "interconnecting member". The term "provide" may mean "provide and/or form". The term "form" may mean "provide and/or form".

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, embodiments may also cover apparatuses for practicing embodiments. Such apparatus may include circuits, dedicated and/or programmable, to carry out operations pertaining to embodiments. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments.

Figure 2:
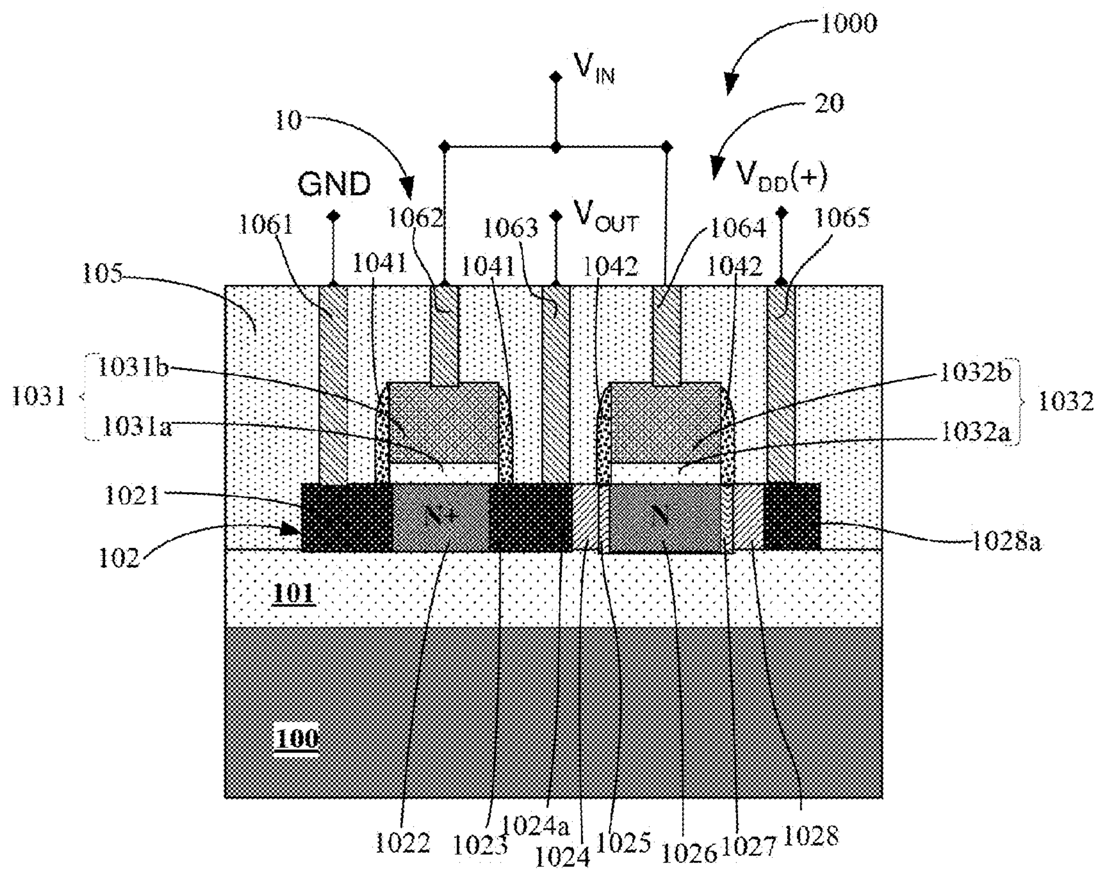
FIG. 2 shows a schematic diagram (e.g., a schematic cross-sectional view) of the semiconductor device taken along a plane indicated by a line AA' indicated in FIG. 1 in accordance with one or more embodiments.

FIG. 1 shows a schematic diagram (e.g., a schematic perspective view) that illustrates elements and/or structures in a semiconductor device 1000 in accordance with one or more embodiments. FIG. 2 shows a schematic diagram (e.g., a schematic cross-sectional view) of the semiconductor device 1000 taken along a plane indicated by a line AA' indicated in FIG. 1 in accordance with one or more embodiments.

The semiconductor 1000 may include a substrate 100, a p-n-junctionless mode n-channel field-effect transistor 10 positioned on the substrate 100, and an inversion mode p-channel field-effect transistor 20 positioned on the substrate 100. The semiconductor device 1000 may include an oxide layer 101 positioned between the substrate 100 and each of the n-channel field-effect transistor 10 and the p-channel field-effect transistor 20.

The substrate 100 may be or may include at least one of a monocrystalline silicon (mono-Si) substrate layer, a polycrystalline silicon (poly-Si) substrate layer, a silicon-on-insulator (SOI) substrate layer, a stacked silicon-on-insulator (SSOI) substrate layer, a stacked silicon-germanium-on-insulator (S—SiGeOI) substrate layer, a silicon-germanium-on-insulator (SiGeOI) substrate layer, a germanium-on-insulator (GeOI) substrate, a germanium (Ge) layer, and a III-V compound semiconductor layer. The oxide layer 101 may be or may include at least one of a berried oxide layer and a silicon oxide (SiO) layer.

The n-channel field-effect transistor 10 may include an n-type silicide source portion 1021, an n-type silicide drain portion 1023, and an n-type channel region 1022. The n-type channel region 1022 may be positioned between the n-type silicide source portion 1021 and the n-type silicide drain portion 1023 and may directly contact each of the n-type silicide source portion 1021 and the n-type silicide drain portion 1023.

The p-channel field-effect transistor 20 may include a p-type source portion 1027, a p-type source portion 1028, a p-type drain portion 1025, a p-type drain portion 1024, and an n-type channel region 1026. A doping concentration value of the n-type channel region 1026 may be less than a doping concentration value of the n-type channel region 1022. The n-type channel region 1026 may be positioned between the p-type source portion 1027 and the p-type drain portion 1025. The p-type source portion 1027 and the p-type drain portion 1025 may be positioned between the p-type source portion 1028 and the p-type drain portion 1024. A doping concentration value of the p-type source portion 1027 may be less than a doping concentration value of the p-type source portion 1028.

The p-channel field-effect transistor 20 may include a p-type silicide source portion **1028*a* and a p-type silicide drain portion 1024*a*. The p-type source portion 1028 and the p-type drain portion 1024 may be positioned between the p-type silicide source portion 1028*a* and the p-type silicide drain portion 1024*a*. The p-type silicide drain portion 1024*a* may directly contact the n-type silicide drain portion 1023**.

The channel region 1022 of the n-channel field-effect transistor 10 may be a first portion of a fin structure 102 (or fin member 102). The channel region 1026 of the p-channel field-effect transistor 20 may be a second portion of the fin structure 102. The fin structure 102 may be formed of or may include at least one of silicon, germanium, silicon-germanium, and a III-V compound semiconductor material. One or more of a cross section of the fin structure 102, a cross section of the channel region 1022, and a cross section of the channel region 1026 may have at least one of a linear shape, a triangular shape, a rectangular shape, and a circular shape.

A doping concentration value at a surface portion of a channel region 1022 may be higher than a doping concentration value at an inner portion of the channel region 1022. The doping concentration of the channel region 1022 may gradually decrease from the surface portion of the channel region 1022 to the inner center portion of the channel region 1022. The doping concentration value at the surface portion of the channel region 1022 may be greater than or equal to 1E19 atoms/cm$^3$ (i.e., $10^{19}$ atoms/cm$^3$).

A doping concentration value at a gate-channel interface of a channel region 1022 (i.e., the interface between the channel region 1022 and a gate structure 1031) may be higher than a doping concentration value at the inner center portion of the channel region 1022. The doping concentration of the channel region 1022 may gradually decrease from the gate-channel interface of the channel region 1022 to the inner center portion of the channel region 1022.

Figure 8A:
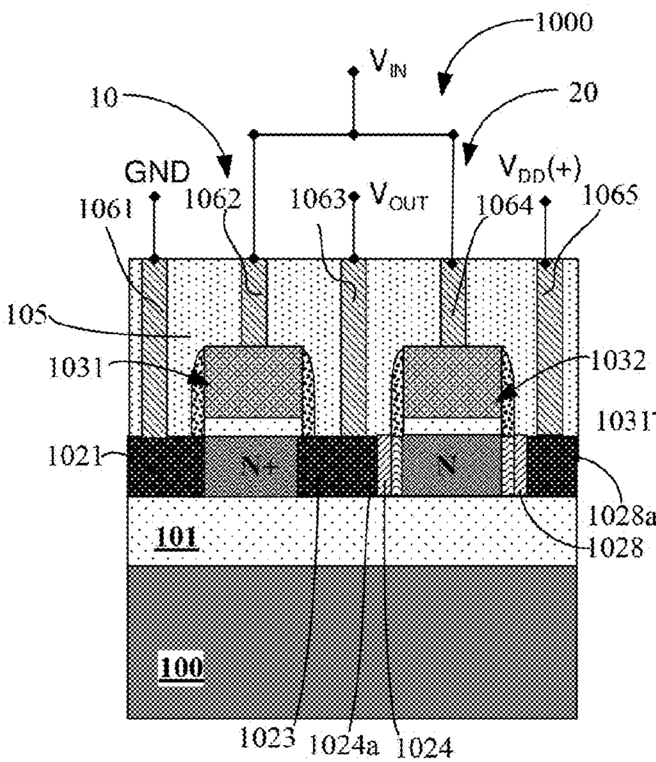
Figure 8B:
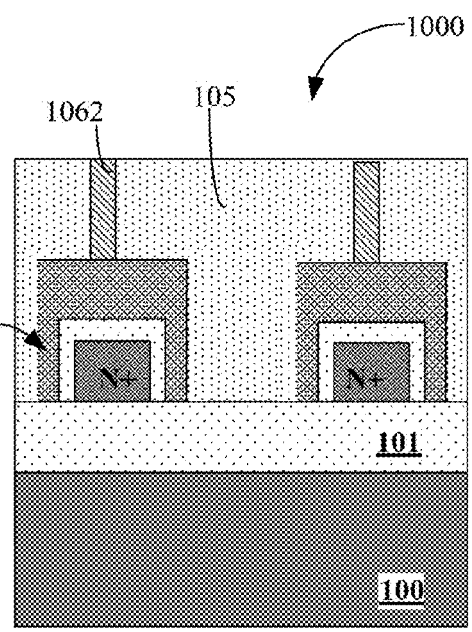

The semiconductor device 1000 is further discussed with reference to FIG. 8A and FIG. 8B.

FIG. 3, FIG. 4A, FIG. 4B, FIG. 5A, FIG. 5B, FIG. 6A, FIG. 6B, FIG. 7A, FIG. 7B, FIG. 8A, and FIG. 8B show schematic diagrams (e.g., schematic cross-sectional views) that illustrate elements and/or structures formed in a method for manufacturing the semiconductor device 1000 in accordance with one or more embodiments. FIG. 3, FIG. 4A, FIG. 5A, FIG. 6A, FIG. 7A, and FIG. 8A may show schematic cross-sectional views taken in a plane indicated by the line AA' indicated in FIG. 1. FIG. 4B, FIG. 5B, FIG. 6B, FIG. 7B, and FIG. 8B may show schematic cross-sectional views taken in a plane indicated by the line BB' indicated in FIG. 1.

Figure 9:
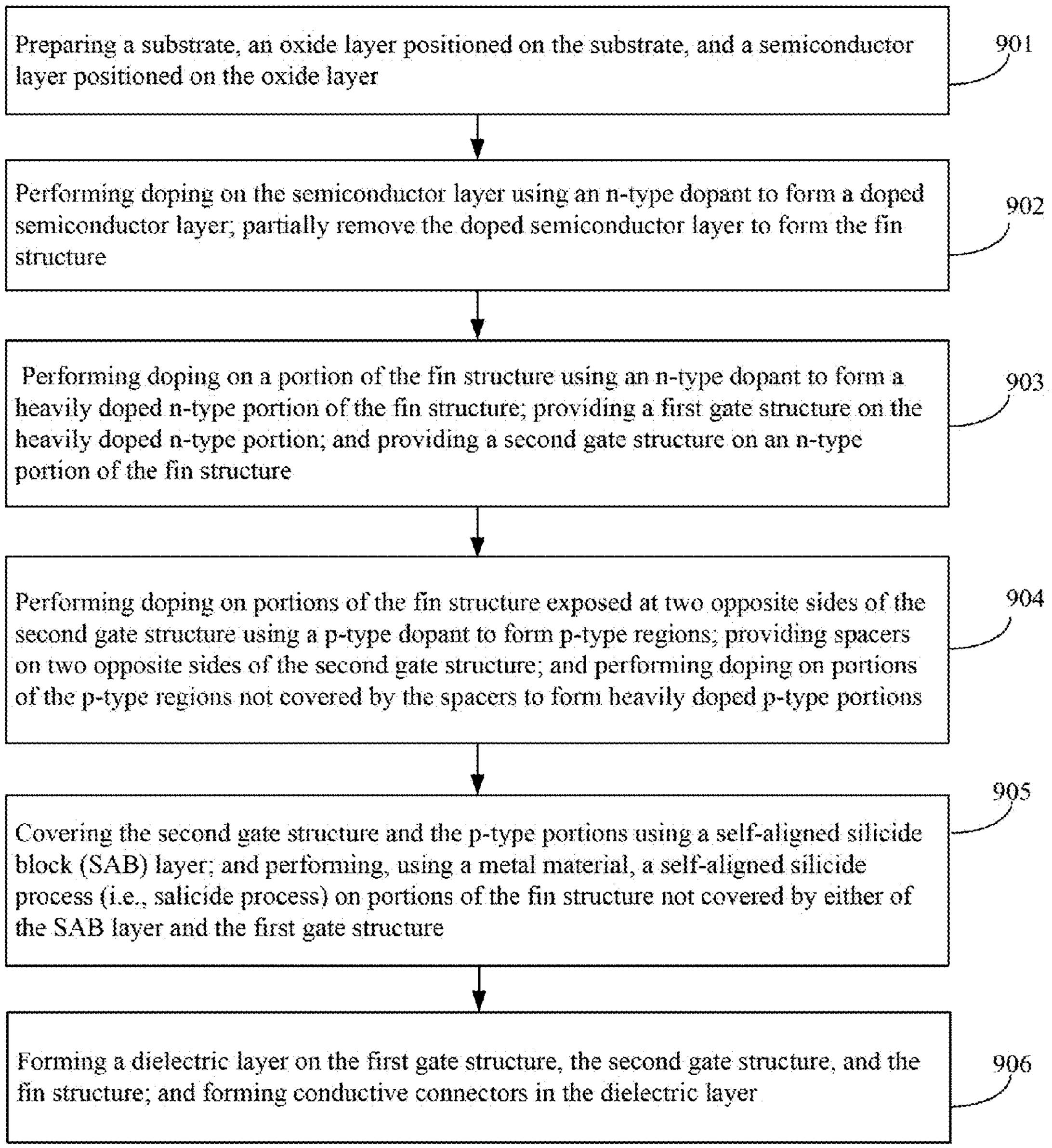
FIG. 9 shows a flowchart that illustrates steps in a method for manufacturing a semiconductor device in accordance with one or more embodiments.

FIG. 9 shows a flowchart that illustrates steps in a method for manufacturing the semiconductor device 1000 in accordance with one or more embodiments. The method may include steps 901, 902, 903, 904, 905, 906, 907, and 908. Sequences of some of the steps may be changed in some embodiments.

Figure 3:
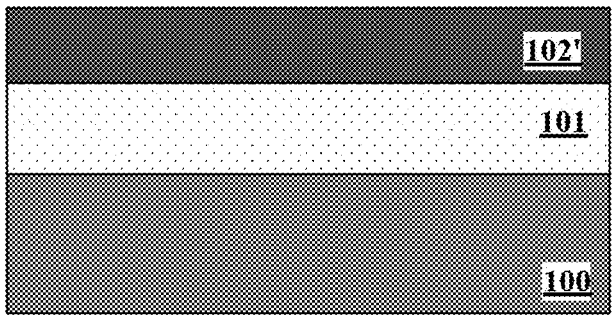
FIG. 3, FIG. 4A, FIG. 4B, FIG. 5A, FIG. 5B, FIG. 6A, FIG. 6B, FIG. 7A, FIG. 7B, FIG. 8A, and FIG. 8B show schematic diagrams (e.g., schematic cross-sectional views) that illustrate elements and/or structures formed in a method for manufacturing a semiconductor device in accordance with one or more embodiments.
Figure 4A:
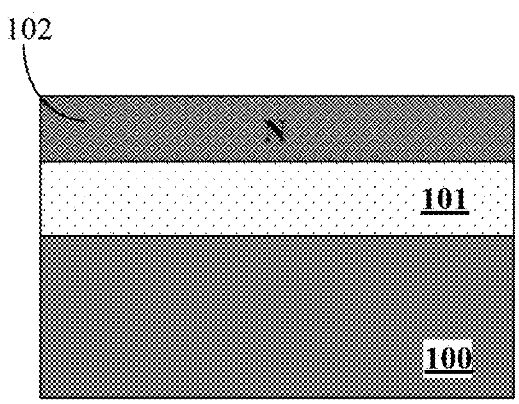
Figure 4B:
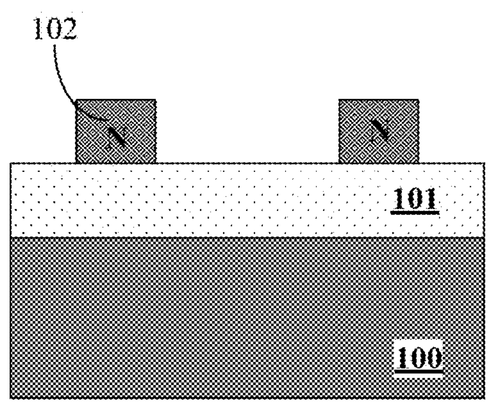
Figure 5A:
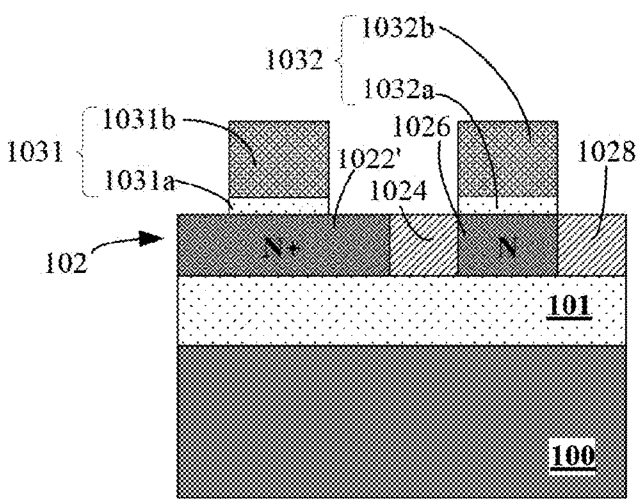
Figure 5B:
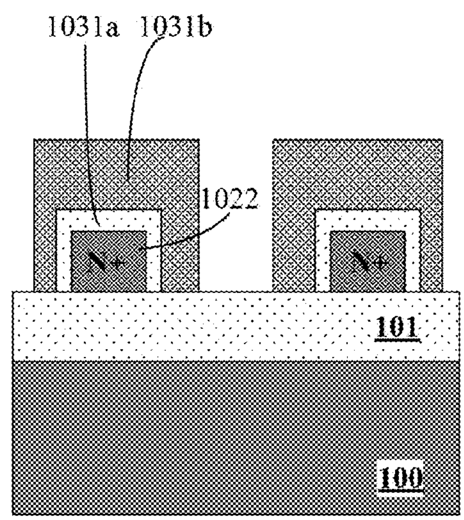
Figure 6A:
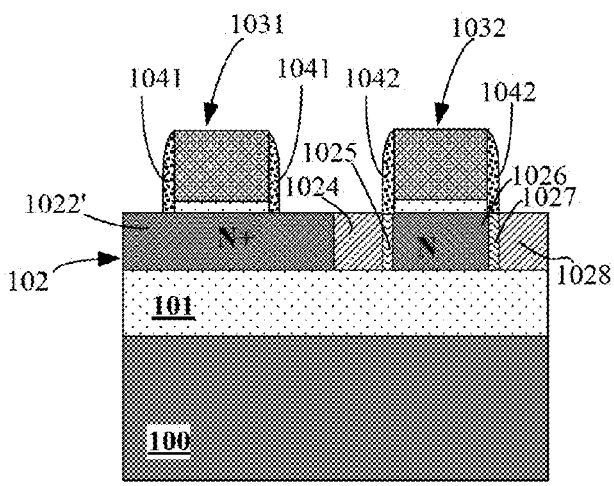
Figure 6B:
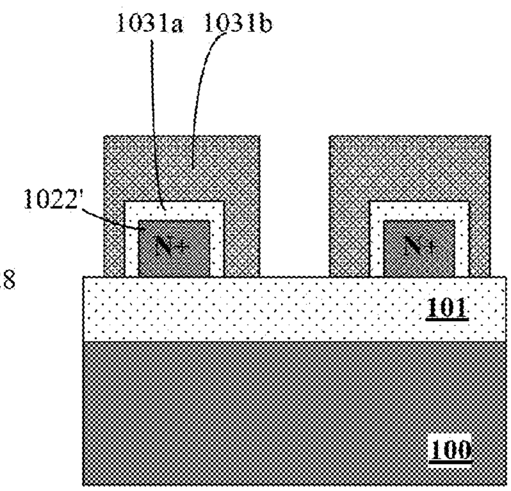
Figure 7A:
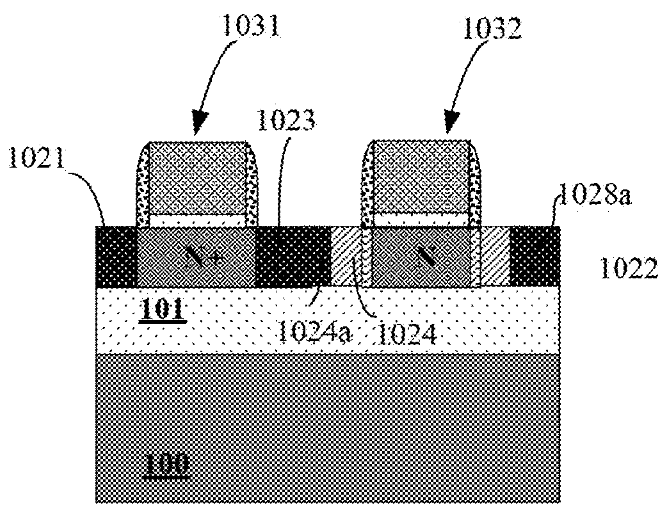
Figure 7B:
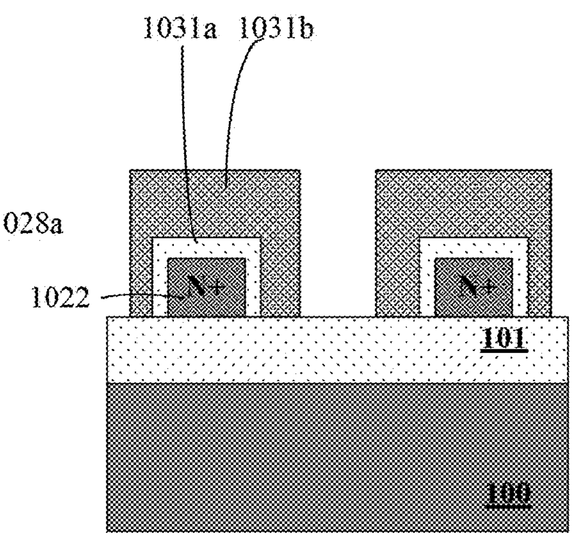

Referring to FIG. 9 and FIG. 3, the step 901 may include preparing a substrate 100, an oxide layer positioned on the substrate 101, and a semiconductor layer 102' positioned on the oxide layer. The substrate 100 may be or may include at least one of a monocrystalline silicon (mono-Si) substrate layer, a polycrystalline silicon (poly-Si) substrate layer, a silicon-on-insulator (SOI) substrate layer, a stacked silicon-on-insulator (SSOI) substrate layer, a stacked silicon-germanium-on-insulator (S—SiGeOI) substrate layer, a silicon-germanium-on-insulator (SiGeOI) substrate layer, a germanium-on-insulator (GeOI) substrate, a germanium (Ge) layer, and a III-V compound semiconductor layer. The oxide layer 101 may be or may include at least one of a berried oxide layer and a silicon oxide (SiO) layer. The semiconductor layer 102' may be formed of or may include at least one of silicon, germanium, silicon-germanium, and a III-V compound semiconductor material.

Referring to FIG. 9, FIG. 3, FIG. 4A, and FIG. 4B, the step 902 may include the following sub-steps: performing doping on the semiconductor layer 102' using an n-type dopant to form a doped semiconductor layer; and partially remove the doped semiconductor layer to form the fin structure 102.

In the step 902, the doping may be performed using one or more ion implantation processes. The n-type dopant may be arsenic (As) or phosphorus (P). The ion implantation process or each of the ion implantation processes may be performed using energy in a range of 5 keV to 40 keV and using dosage in a range of 1E16 cm$^{-2}$ to 5E16 cm$^{-2}$.

The step 902 may include the following sub-steps: forming an oxide layer on the doped semiconductor layer; forming an nitride layer on the oxide layer; forming a mask material layer (e.g., a photoresist layer) on the nitride layer; patterning (e.g., through lithography) the mask material layer to form a patterned mask, which is configured based on one or more predetermined dimensions of the fin structure 102 and a predetermined position of the fin structure 102; through the patterned mask etching the nitride layer, the oxide layer, and the doped semiconductor layer; and removing the patterned mask, the remaining portion of the nitride layer, and the remaining portion of the oxide layer. The patterned mask may be removed through an ashing process. A cross section of the fin structure 102 in a plane indicated by the line BB' (indicated in FIG. 1) may have at least one of a linear shape, a triangular shape, a rectangular shape, and a circular shape.

Referring to FIG. 9, FIG. 4A, FIG. 4B, FIG. 5A, and FIG. 5B, the step 903 may include the following sub-steps: performing doping on a portion of the fin structure 102 using an n-type dopant to form a heavily-doped n-type portion 1022' of the fin structure 102; providing a gate structure 1031 on the heavily-doped n-type portion 1022; and providing a gate structure 1032 on an n-type portion 1026 of the fin structure 102.

In the step 903, the doping may be performed using one or more ion implantation processes. The n-type dopant may be arsenic (As) or phosphorus (P). The ion implantation process or each of the ion implantation processes may be performed using energy in a range of 5 keV to 40 keV and using dosage in a range of 1E16 cm$^{-2}$ to 5E16 cm$^{-2}$. As a result of the doping of the step 904, a doping concentration value at a surface portion of the heavily-doped n-type portion 1022' may be higher than a doping concentration value at an inner portion of the heavily-doped n-type portion 1022'. The doping concentration of the heavily-doped n-type portion 1022' may gradually decrease from the surface portion of the heavily-doped n-type portion 1022' to the inner center portion of the heavily-doped n-type portion 1022'. The doping concentration value at the surface portion of the heavily-doped n-type portion 1022' may be greater than or equal to 1E19 atoms/cm$^3$ (i.e., $10^{19}$ atoms/cm$^3$). A portion of the surface portion of the heavily-doped n-type portion 1022' may become a gate-channel interface portion of the subsequently formed channel region 1022 of the p-n-junctionless mode n-channel field-effect transistor 10. The doping concentration values and doping concentration distribution of the heavily-doped n-type portion 1022' may be substantially equivalent to the doping concentration values and doping concentration distribution of the subsequently formed channel region 1022 of the p-n-junctionless mode n-channel field-effect transistor 10.

Each of the gate structure 1031 and the gate structure 1032 may directly contact two or more sides of the fin structure 102. Each of the gate structure 1031 and the gate structure 1032 may directly contact all sides of the fin structure 102 except the two opposite end sides of the fin structure 102 and except the side of the fin structure 102 that contacts the oxide layer 101. A cross section of the fin structure 102 on the plane indicated by the line BB' (indicated in FIG. 1) may have a rectangular shape, and each of the gate structure 1031 and the gate structure 1032 may directly contact three sides of the fin structure 102.

The gate structure 1031 may include a dielectric layer 1031$a$ and a conductive gate member 1031$b$. The gate structure 1032 may include a dielectric layer 1032$a$ and a conductive gate member 1032$b$.

Each of the dielectric layer 1031$a$ and the dielectric layer 1032$a$ may directly contact the fin structure 102. Each of the dielectric layers 1031$a$ and 1032$a$ may be formed of one or more high-k materials. A dielectric constant of each of the dielectric layers 1031$a$ and 1032$a$ may be greater than or equal to 3.9. Each of the dielectric layers 1031*a* and 1032*a* may be formed of at least one of silicon oxide, silicon nitride, and silicon oxynitride. A dielectric constant of each of the dielectric layers 1031*a* and 1032*a* may be greater than or equal to 20. Each of the dielectric layers 1031*a* and 1032*a* may be formed of at least one of hafnium silicon oxynitride, hafnium oxide, hafnium silicate, lanthanum oxide, zirconium oxide, zirconium silicon oxide, titanium oxide, tantalum oxide, barium strontium titanium oxide, barium titanium oxide, strontium titanium oxide, aluminum oxide, titanium oxide, barium strontium titanate (BST), and lead zirconate titanate (PZT).

The gate member 1031*b* and the gate member 1032*b* may respectively directly contact the dielectric layer 1031*a* and the dielectric layer 1032*a*. Each of the gate members 1031*b* and 1032*b* may be formed of one or more of a metal, a metal alloy, a metal nitride, a metal silicide, and a doped polysilicon. Each of the gate members 1031*b* and 1032*b* may have single-layer structure, a multilayer structure, a laminated/stacked structure, or a composite structure. In an embodiment, each of the gate members 1031*b* and 1032*b* may be formed of chromium (Cr) and/or gold (Au). In an embodiment, each of the gate members 1031*b* and 1032*b* may be formed of a doped polysilicon, a combination of polysilicon and germanium alloy, and/or a metal silicide. A doping concentration of the doped polysilicon may be in a range of 1E18 atoms/cm$^3$ to 1E22 atoms/cm$^3$.

The step 903 may include the following sub-steps: forming a dielectric material layer on the fin structure 102 and exposed portions of the oxide layer 101; forming a gate material layer on the dielectric material layer; forming a first mask material layer on the gate material layer; forming a second mask material layer (e.g., a photoresist layer) on the first mask material layer; patterning (e.g., through lithography) the second mask material layer to form a first patterned mask, which is configured based predetermined dimensions and positions of the gate structures 1031 and 1032; through the first patterned mask patterning (e.g., through etching) the first mask material layer to form a second patterned mask (e.g., a hard mask); removing the first patterned mask; through the second patterned mask etching (e.g., using a dry etching process) the gate material layer and the dielectric material layer to form the gate structures 1031 and 1032; and removing the second patterned mask.

In an embodiment, the method may include performing doping on two portions of the heavily-doped portion 1022' that are positioned at two opposite sides of the gate structure 1031 and not covered by the gate structure 1031 using an n-type dopant, for ensuring that the two portions are equally heavily-doped n-type portions for functioning as a source portion and a drain portion. In an embodiment, the two portions may be heavily-doped in the step 902.

Referring to FIG. 9, FIG. 5A, FIG. 5B, FIG. 6A, and FIG. 6B, the step 904 may include the following sub-steps: performing doping on portions of the fin structure 102 exposed at two opposite sides of the gate structure 1032 using a p-type dopant to form lightly-doped p-type regions; providing two spacers 1041 on two opposite sides of the gate structure 1031, respectively; providing two spacers 1042 on two opposite sides of the gate structure 1032; performing doping on portions of the p-type regions not covered by the spacers 1042 to form heavily-doped p-type portions 1024 and 1028. Therefore, a (lightly-doped) p-type portion 1025 is positioned between the n-type portion 1026 and the heavily-doped p-type portion 1024, and a (lightly-doped) p-type portion 1027 is positioned between the n-type portion 1026 and the heavily-doped p-type portion 1028.

In the step 904, the formation of the lightly-doped p-type regions may be performed using one or more ion implantation processes and/or one or more diffusion processes for doping boron (B) impurities.

The spacers 1041 and the spacers 1042 may be formed of one or more insulating materials, such as silicon nitride, silicon oxide, and/or silicon oxynitride. The spacers 1041 and 1042 may enable mitigation of short-channel effects and related hot-carrier effects. Each of a thickness of a spacer 1041 and a thickness of a spacer 1042 in a direction parallel to an extension direction of the fin structure 102 may be greater than or equal to 80 angstroms.

The formation of heavily-doped p-type portions 1024 and 1028 may be performed using one or more ion implantation processes and/or one or more diffusion processes for doping boron (B) impurities. Subsequently or immediately subsequently, a rapid thermal annealing process may be performed at a temperature in a range of 900 Celsius degrees to 1050 Celsius degrees, for activating impurities doped in one or more of the doped portions 1024, 1027, 1025, 1028, and 1022', and/or for repairing the lattice structure at the surface of the substrate 100, which may have been damaged in one or more of the aforementioned doping processes.

Referring to FIG. 9, FIG. 6A, FIG. 6B, FIG. 7A, and FIG. 7B, the step 905 may include the following sub-steps: covering the gate structure 1032 and the p-type portions 1024, 1025, 1026, and 1027 using a self-aligned silicide block (SAB) layer, wherein the p-type portions 1024 and 1028 may be partially exposed (without being completely covered) by the SAB layer; and performing, using a metal material, a self-aligned silicide process (i.e., salicide process) on exposed portions of the fin structure 102 not covered by either of the SAB layer and the gate structure 1031.

As a result, silicide portions 1021, 1023, 1024*a*, and 1028*a* may be formed in the fin structure 102. The silicide portions 1021 and 1023 may correspond to two portions of the heavily-doped n-type portion 1022'. The silicide portion 1024*a* may correspond to a portion of the heavily-doped p-type portion 1024 and may directly contact the silicide portion 1023. The silicide portion 1028*a* may correspond to a portion of the heavily-doped p-type portion 1028.

The self-aligned silicide process (i.e., salicide process) may include the following sub-steps: depositing a metal layer on exposed portions of the fin structure 102 that are not covered by either of the SAB layer and the gate structure 1031; performing thermal annealing on at least the metal layer for causing reaction between the exposed portions of the fin structure 102 and the metal layer to form the metal silicide portions 1021, 1023, 1024*a*, and 1028*a*; and removing the remaining metal layer that does not substantially react with the fin structure 102 and remains after the annealing. The exposed portions of the fin structure 102 may substantially or completely turn into the metal silicide portions 1021, 1023, 1024*a*, and 1028*a*.

The SAB layer may be formed of silicon oxide and/or silane. The metal layer may be formed of one or more of nickel (Ni), cobalt (Co), and platinum (Pt). A thickness of the metal layer (in a direction perpendicular to the bottom side of the substrate 100) may be in a range of 5 nm to 50 nm. The thermal annealing may be rapid thermal annealing performed in a nitrogen (N) atmosphere at about 500 Celsius degrees. The remaining metal layer may be removed using a sulfuric acid and hydrogen peroxide mixture (SPM) solution. In the SPM solution, the volume ratio of the hydrogen peroxide to the sulfuric acid may be 1:4.

The method may include determining a material of the metal layer based on a material of the fin structure 102. In an embodiment, the fin structure 102 may include germanium (Ge), and the metal layer may include nickel (Ni), cobalt (Co), and/or platinum (Pt). In an embodiment, the fin structure 102 may include silicon (Si), and the metal layer may include nickel (Ni) and/or cobalt (Co).

Referring to FIG. 9, FIG. 7A, FIG. 7B, FIG. 8A, and FIG. 8B, the step 906 may include the following sub-steps: forming a dielectric layer 105 that covers the gate structure 1031, the gate structure 1032, and the fin structure 102; and forming conductive connectors 1061, 1062, 1063, 1064, and 1065 in the dielectric layer 105.

A dielectric constant of the dielectric layer 105 may be less than or equal to 3.9. The dielectric layer 105 may be formed of at least one of a fluorinated silicate glass (FSG), a carbon-containing material, a porous-material), silicon oxide, etc. The dielectric layer 105 may be formed using one or more of a thermal chemical vapor deposition (thermal CVD) process, a high density plasma (HDP) process, and a chemical-mechanical planarization (CMP) process.

The connectors 1061, 1062, 1063, 1064, and 1065 may be formed of one or more conductive materials, such as copper (Cu). The connectors may be formed using a Damascene process.

The connector 1061 may be electrically connected to and/or directly contact the heavily doped n-type metal silicide portion 1021. The heavily doped n-type metal silicide portion 1021 may function as a source portion of the p-n-junctionless mode n-channel field-effect transistor 10. The connector 1061 may be electrically connected to ground for receiving a ground voltage GND when the semiconductor device 1000 is in use.

The connector 1062 may be electrically connected to and/or directly contact the gate structure 1031 (and/or the gate member 1031*b*). The connector 1061 may be electrically connected to an input terminal of the semiconductor device 1000 for receiving an input voltage $V_{IN}$ when the semiconductor device 1000 is in use.

The connector 1063 may be electrically connected to and/or directly contact the heavily doped n-type metal silicide portion 1023 and/or the heavily doped p-type metal silicide portion 1024*a*. The heavily doped n-type metal silicide portion 1023 may function as a drain portion of the p-n-junctionless mode n-channel field-effect transistor 10. The heavily doped p-type metal silicide portion 1024*a* may function as (a portion of) a drain portion of the inversion mode p-channel field-effect transistor 20. The connector 1063 may be electrically connected to an output terminal of the semiconductor device 1000 for providing an output voltage $V_{OUT}$ when the semiconductor device 1000 is in use.

The connector 1064 may be electrically connected to and/or directly contact the gate structure 1032 (and/or the gate member 1032*b*). The connector 1064 may be electrically connected to the input terminal of the semiconductor device 1000 for receiving the input voltage $V_{IN}$ when the semiconductor device 1000 is in use.

The connector 1065 may be electrically connected to and/or directly contact the heavily doped p-type metal silicide portion 1028*a*. The heavily doped p-type metal silicide portion 1028*a* may function as (a portion of) a source portion of the inversion mode p-channel field-effect transistor 20. The connector 1065 may be electrically connected to a power supply terminal for receiving positive supply voltage $V_{DD}(+)$ when the semiconductor device 1000 is in use.

In the inversion mode p-channel field-effect transistor 20, the channel region 1026 may be positioned between the two lightly-doped p-type portions 1025 and 1027. The two lightly-doped p-type portions 1025 and 1027 may be positioned between the two heavily-doped p-type portions 1024 and 1028. The two heavily-doped p-type portions 1024 and 1028 may be positioned between the two heavily-doped p-type metal silicide portions 1024*a* and 1028*a*.

According to embodiments, the semiconductor device 1000 may function as a complementary metal-oxide-semiconductor (CMOS) inverter. According to embodiments, the channel region 1022 and/or the channel region 1026 may have substantially high mobility, and the semiconductor device 1000 may perform sufficiently strong electron inversion. Advantageously, satisfactory performance of the semiconductor device 1000 (and an associated electronic device) may be attained.

An embodiment may be related to an electronic device. The electronic device may include an electronic component and the semiconductor device 1000, which may be electrically connected to the electronic component. The semiconductor device 1000 may have the above-discussed features.

In an embodiment, the electronic device may be or may include one or more of a mobile phone, a tablet computer, a notebook computer, a netbook, a game console, a television, a video compact disc (VCD) player, a digital video disc (DVD) player, a navigation device, a camera, a camcorder, a voice recorder, an MP3 player, an MP4 player, a portable game device, etc.

In an embodiment, the electronic device may be or may include an intermediate product (e.g., a mobile phone main board) or module including a semiconductor device that may have one or more of the features and advantages discussed above.

While some embodiments have been described as examples, there are alterations, permutations, and equivalents. It should also be noted that there are many alternative ways of implementing the methods and apparatuses. Furthermore, embodiments may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents.

What is claimed is:

1. A method for manufacturing a semiconductor device, the method comprising:

preparing a substrate;

providing an n-channel field-effect transistor positioned on the substrate, wherein the n-channel field-effect transistor comprises an n-type silicide source portion, an n-type silicide drain portion, and a first n-type channel region, and wherein the first n-type channel region is positioned between the n-type silicide source portion and the n-type silicide drain portion and directly contacts each of the n-type silicide source portion and the n-type silicide drain portion, wherein the entire first n-type channel region has a same conductivity type and a same width, and a doping concentration value at a gate-channel interface of the first n-type channel region is higher than a doping concentration value at an inner center portion of the first n-type channel region, and wherein the n-type silicide source portion, the n-type silicide drain portion, and the first n-type channel region have a same height; and providing a p-channel field-effect transistor positioned on the substrate.

2. The method of claim 1, wherein the first n-type channel region is a first portion of a fin structure, wherein the p-channel field-effect transistor comprises a second n-type channel region, wherein the second n-type channel region is a second portion of the fin structure, and wherein the fin structure is formed of or comprises at least one of germanium, silicon-germanium, and a III-V compound semiconductor material.

3. The method of claim 2, wherein a doping concentration value of the second n-type channel region is less than a doping concentration value of the first n-type channel region.

4. The method of claim 1, wherein a doping concentration of the first n-type channel region decreases from the gate-channel interface of the first n-type channel region to the inner center portion of the first n-type channel region.

5. The method of claim 1, wherein the p-channel field-effect transistor comprises a p-type silicide source portion, a p-type silicide drain portion, and a second n-type channel region, and wherein the second n-type channel region is positioned between the p-type silicide source portion and the p-type silicide drain portion.

6. The method of claim 1, wherein the p-channel field-effect transistor comprises a first p-type source portion, a second p-type source portion, a first p-type drain portion, a second p-type drain portion, and a second n-type channel region, wherein the second n-type channel region is positioned between the first p-type source portion and the first p-type drain portion, wherein the first p-type source portion and the first p-type drain portion are positioned between the second p-type source portion and the second p-type drain portion, and wherein a doping concentration value of the first p-type source portion is less than a doping concentration value of the second p-type source portion.

7. The method of claim 6, wherein the p-channel field-effect transistor comprises a p-type silicide source portion and a p-type silicide drain portion, and wherein the second p-type source portion and the second p-type drain portion are positioned between the p-type silicide source portion and the p-type silicide drain portion.

* * * * *